(12) United States Patent
Preikszas

(10) Patent No.: US 10,629,404 B2
(45) Date of Patent: Apr. 21, 2020

(54) METHOD FOR ADJUSTING A PARTICLE BEAM MICROSCOPE

(71) Applicant: Carl Zeiss Microscopy GmbH, Jena (DE)

(72) Inventor: Dirk Preikszas, Oberkochen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 16/188,542

(22) Filed: Nov. 13, 2018

(65) Prior Publication Data

US 2019/0148104 A1    May 16, 2019

(30) Foreign Application Priority Data

Nov. 15, 2017   (DE) ........................ 10 2017 220 398

(51) Int. Cl.
| | |
|---|---|
| *H01J 37/10* | (2006.01) |
| *H01J 37/26* | (2006.01) |
| *H01J 37/28* | (2006.01) |
| *H01J 37/147* | (2006.01) |
| *H01J 37/22* | (2006.01) |

(52) U.S. Cl.
CPC .......... *H01J 37/1471* (2013.01); *H01J 37/10* (2013.01); *H01J 37/222* (2013.01); *H01J 37/265* (2013.01); *H01J 37/28* (2013.01); *H01J 2237/1501* (2013.01)

(58) Field of Classification Search
CPC ...... H01J 37/1471; H01J 37/10; H01J 37/222; H01J 37/265; H01J 37/28; H01J 2237/1501

USPC ..... 250/306, 307, 309, 310, 311, 396 R, 397
See application file for complete search history.

(56) References Cited

U.S. PATENT DOCUMENTS

| | | | |
|---|---|---|---|
| 6,067,164 A | 5/2000 | Onoguchi et al. | |
| 6,864,493 B2 | 3/2005 | Sato et al. | |
| 7,605,381 B2 | 10/2009 | Sato et al. | |
| 2002/0179851 A1 | 12/2002 | Sato et al. | |
| 2005/0006598 A1 | 1/2005 | Pearl | |
| 2012/0138793 A1 | 6/2012 | Yamada et al. | |
| 2013/0320846 A1 | 12/2013 | Yamada | |
| 2015/0362713 A1* | 12/2015 | Betzig | G02B 21/0064 250/459.1 |
| 2016/0203948 A1* | 7/2016 | Huynh | H01J 37/20 250/307 |
| 2016/0225578 A1* | 8/2016 | Preikszas | H01J 37/28 |
| 2016/0225579 A1* | 8/2016 | Preikszas | H01J 37/21 |
| 2017/0003235 A1* | 1/2017 | Firnkes | H01J 37/26 |

FOREIGN PATENT DOCUMENTS

EP   2 309 530 B1   3/2016

OTHER PUBLICATIONS

German Office Action, with translation thereof, for corresponding DE application No. 10 2017 220 398.6, dated Jun. 26, 2018.

\* cited by examiner

*Primary Examiner* — Nicole M Ippolito
(74) *Attorney, Agent, or Firm* — Fish & Richardson P.C.

(57) ABSTRACT

A method of adjusting a particle beam microscope includes measures A, B, C and D.

20 Claims, 5 Drawing Sheets

METHOD FOR ADJUSTING A PARTICLE BEAM MICROSCOPE

CROSS-REFERENCE TO RELATED APPLICATION

The present application claims benefit under 35 USC 119 of German Application No. 10 2017 220 398.6, filed Nov. 15, 2017. The entire disclosure of these applications are incorporated by reference herein.

FIELD

The disclosure relates to methods for adjusting a particle beam microscope, and in this respect in particular to methods in which the position of a particle beam relative to a main axis of an objective lens of the particle beam microscope is adjusted.

BACKGROUND

Particle beam microscopes, such as electron beam microscopes or ion beam microscopes, are complex technical systems which are adjusted for optimum operation. One aspect of the adjustment of particle beam microscopes relates to the adjustment of the particle beam that is directed at the object to be examined relative to the objective lens with which the particle beam is focused on the object. Since the effect of imaging aberrations of the objective lens on the particle beam increases with the distance at which trajectories of the particles passing through the objective lens are situated from a main axis of the objective lens, it is desirable to centre the particle beam passing through the objective lens relative to the main axis. To this end, the particle beam microscope includes a beam adjustment device, which is arranged between the particle source for producing the particle beam and the objective lens and which is set such that it steers or selects the particle beam in a manner such that it passes through the objective lens in a centred fashion with respect to the main axis thereof. Determining the setting of the beam adjustment device that is involved herefor is typically performed in a separate method for adjusting the particle beam microscope in order to improve the efficiency of the particle beam microscope.

A conventional method for this purpose is known from EP 2 309 530 B1. In this conventional method (cf. FIG. 2 of EP 2 309 530 B1), a first image is recorded in a first setting of the beam adjustment device and a first setting of the objective lens. Next, a second image is recorded in the first setting of the beam adjustment device and a second setting of the objective lens. Next, a third image is recorded in a second setting of the beam adjustment device and the first setting of the objective lens. Next, a fourth image is recorded in the second setting of the beam adjustment device and the second setting of the objective lens. Due to the different settings, the four recorded images are displaced relative to one another. Corresponding displacements can be determined by analysing the images, provided the imaged object is sufficiently structured. An optimized setting of the beam adjustment device is calculated from the ascertained displacements. Using this optimized setting of the beam adjustment device and the first setting of the objective lens, high-quality images are then recorded.

SUMMARY

The disclosure seeks to provide a method for adjusting a particle beam relative to an objective lens in a particle beam microscope which brings about comparatively good results.

Proposed according to the disclosure is a method for adjusting a particle beam microscope which includes a particle source for producing a particle beam, an objective lens for focusing the particle beam on an object, and a beam adjustment device arranged in the beam path between the particle source and the objective lens, and wherein the method includes: setting the beam adjustment device and the objective lens in four different settings and recording an image of the object at each setting, determining an optimized setting of the beam adjustment device based on the four images and recording at least one further image at the setting of the beam adjustment device in the optimized setting.

In accordance with exemplary embodiments, recording the four images includes the following measures:

Measure A: setting the beam adjustment device to a first setting W1, setting an excitation of the objective lens to a first objective lens excitation value I1, and recording a first image of the object;

Measure B: setting the beam adjustment device to a second setting W2, which differs from the first setting W1, setting the excitation of the objective lens to the first objective lens excitation value I1, and recording a second image of the object;

Measure C: setting the beam adjustment device to the first setting W1, setting the excitation of the objective lens to a second objective lens excitation value I2, which differs from the first objective lens excitation value I1, and recording a third image of the object;

Measure D: setting the beam adjustment device to the second setting W2, setting the excitation of the objective lens to the second objective lens excitation value I2, and recording a fourth image of the object.

The method then further includes determining an optimized setting Wopt of the beam adjustment device based on the first image, the second image, the third image and the fourth image, determining a third objective lens excitation value I3 and setting the beam adjustment device to the optimized setting Wopt, setting the excitation of the objective lens to the third objective lens excitation value I3 and recording at least one further image, wherein the third objective lens excitation value I3 is determined such that the following relation is satisfied:

$$I3 = I1 + K*(I2-I1)$$

wherein
I1 is the first objective lens excitation value,
I2 is the second objective lens excitation value,
I3 is the third objective lens excitation value, and
K is a predetermined value.

In the above-explained conventional method, four images are recorded at two different settings of the beam adjustment device and two different settings of the objective lens. The two different settings of the objective lens are brought about by two different settings of the current used to excite the objective lens. In this case, different settings of this current are used repeatedly in succession.

However, the magnetic field, which is generated by a set current for exciting the objective lens, for focusing the particle beam at a given time is not dependent only on the current for exciting the lens, which is set at the time, but also on the history of previously set currents. This is due to the hysteresis of the magnetic objective lens.

It has been found that the hysteresis of the objective lens in the conventional method for adjusting the particle beam relative to the objective lens is an obstacle to achieving an optimized result that satisfies higher demands.

Accordingly, after the recording of the four images, the determining of the optimized setting of the beam adjustment device Wopt and the setting of the beam adjustment device to the optimized setting Wopt for recording the at least one further image, the excitation of the objective lens is not set again to the first objective lens excitation value I1, but to the third objective lens excitation value I3, which is determined in accordance with the above-stated relation, in order to take account of the effects of the hysteresis of the objective lens. The predetermined value K depends on the configuration of the objective lens and can be determined for example by way of experiment.

If it is assumed that the first objective lens excitation value was previously set to permit recording of a comparatively well focused image of the object, the excitation of the objective lens for adjusting the particle beam relative to the objective lens is changed to the second objective lens excitation value and is then set back again to the first objective lens excitation value in the conventional method. Due to the hysteresis of the objective lens, the magnetic field which arises when the excitation of the objective lens is set a second time to the first objective lens excitation value differs from the magnetic field which was set when the excitation of the objective lens was set the first time to the first objective lens excitation value. However, the conventional method assumes that the successively performed settings of the first objective lens excitation value and the second objective lens excitation value result in respectively identical settings of the focusing of the objective lens. Since this assumption is not met, the desired adjustment cannot be sufficiently attained. On the other hand, the setting performed in the embodiment described here of the excitation of the objective lens to the third objective lens excitation value, which takes account of the hysteresis of the objective lens, gives a better result.

According to a further exemplary embodiment, the method for recording the four images includes the following measures:

Measure A: setting the beam adjustment device to a first setting W1, setting an excitation of the objective lens to a first objective lens excitation value I1, and recording a first image of the object; and then Measure B: setting the beam adjustment device to the first setting W1, setting the excitation of the objective lens to a second objective lens excitation value I2, which differs from the first objective lens excitation value I1, and recording a second image of the object; and then Measure C: setting the beam adjustment device to a second setting W2, which differs from the first setting W1, setting the excitation of the objective lens to the second objective lens excitation value I2, and recording a third image of the object; and then Measure D: setting the beam adjustment device to the second setting W2, setting the excitation of the objective lens to a third objective lens excitation value I3, which differs from the first objective lens excitation value I1 and from the second objective lens excitation value I2, and recording a fourth image of the object. One way in which the third objective lens excitation value I3 can arise before the setting of the excitation of the objective lens to the third objective lens excitation value I3 is performed will be explained below.

In that case, the method then further includes determining an optimized setting Wopt of the beam adjustment device based on the first image, the second image, the third image and the fourth image, determining the third objective lens excitation value I3 and setting the beam adjustment device to the optimized setting Wopt, setting the excitation of the objective lens to the third objective lens excitation value I3 and recording at least one further image, wherein the third objective lens excitation value I3 is determined such that the following relation is satisfied:

$$I3 = I1 + K^*(I2 - I1)$$

wherein

I1 is the first objective lens excitation value I1,
I2 is the second objective lens excitation value I2,
I3 is the third objective lens excitation value I3, and
K is a predetermined value.

Once again, here the third objective lens excitation value is determined in accordance with the specified relation such that the effects of the hysteresis are taken into account.

In the previously explained methods, measures, such as the measures A to D, are performed, which include in each case setting the beam adjustment device, the excitation of the objective lens or even other devices. These measures of setting include not only measures in which the device is set to a new, changed and not previously set value. Rather, the measures include setting the device such that, after the measure is performed, it is set to the desired value, independently of the value to which it was set before the measure was performed. It is thus in particular possible for a previously existing setting to be maintained here.

According to exemplary embodiments, the beam adjustment device can include a beam deflector, wherein setting the beam adjustment device includes setting an excitation of the beam deflector. The beam deflector can be in particular an electrostatic beam deflector that is excitable with electrical voltage and/or a magnetic beam deflector that is excitable with electric current.

In accordance with further exemplary embodiments, the beam adjustment device can include a stop, including a plate and a hole in the plate through which the particle beam passes, wherein the stop is displaceable in at least one direction transversely to the direction of the particle beam. Setting the beam adjustment device here includes displacing the stop in the at least one direction.

BRIEF DESCRIPTION OF THE DRAWINGS

Embodiments of the disclosure are explained below on the basis of figures, in which in detail:

FIG. 3 shows a schematic diagram further explaining the method shown in

FIG. 2;

DESCRIPTION OF EXEMPLARY EMBODIMENTS

Figure 1:
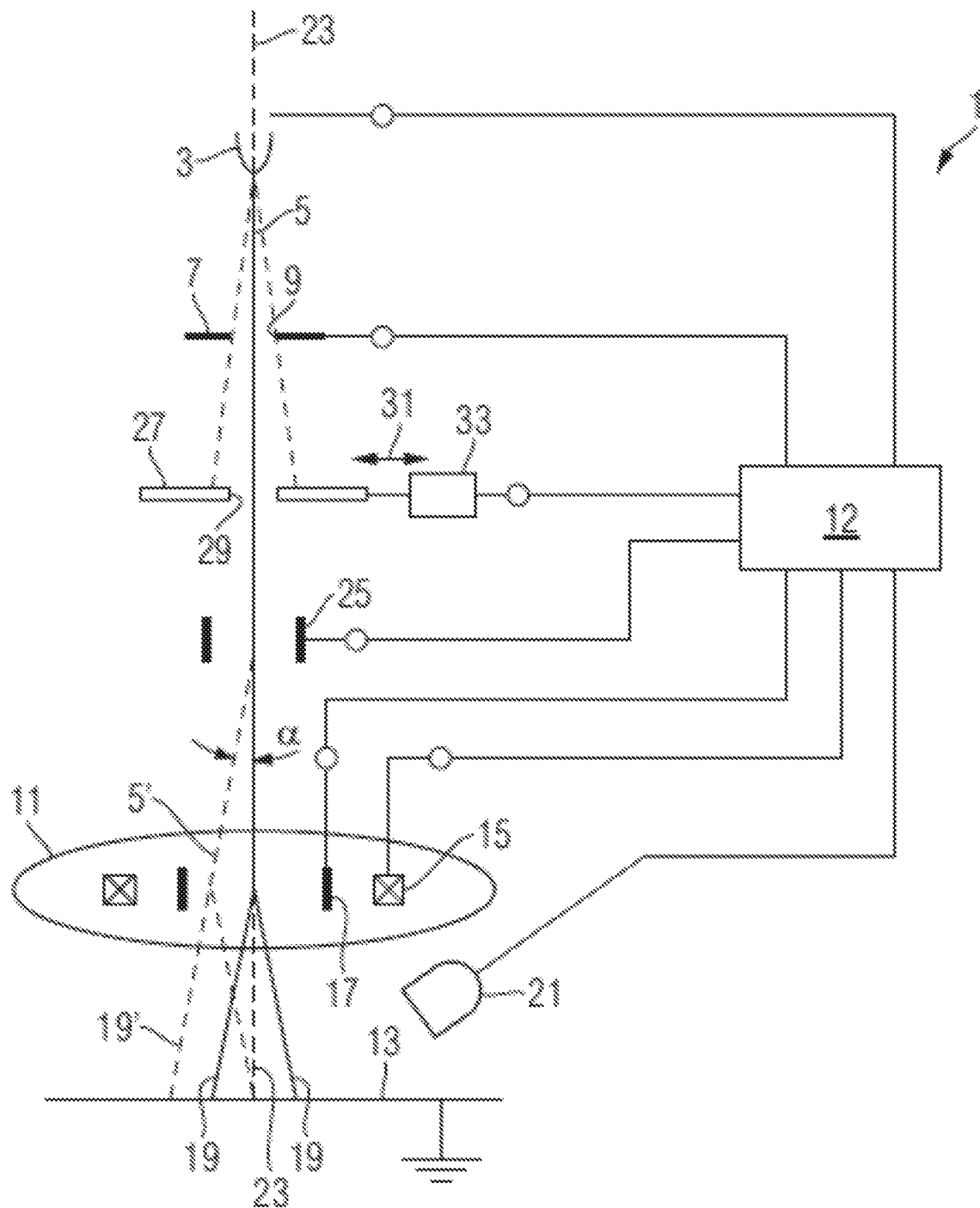
FIG. 1 shows a schematic illustration of a particle beam microscope.

FIG. 1 is a simplified schematic diagram of a particle beam microscope, with which embodiments of the method for adjusting the particle beam microscope can be performed. The simplified schematic diagram here only contains components of the particle beam microscope that are relevant for performing the method explained here. Moreover, a typical electron microscope includes a multiplicity of further components, although these have been omitted in the diagram of FIG. 1 to facilitate the explanation of the method.

The particle beam microscope 1 includes a particle source 3 for producing a particle beam 5 and an anode 7 with an opening 9. The particle source 3 is operated by a controller 12, which also applies a predetermined electric potential (e.g. with respect to ground) to the particle source. An electric potential applied by the controller 12 to the anode stop 7 then determines, together with the electric potential of the particle source 3, the kinetic energy the particles of the particle beam 5 possess after passing through the opening 9 of the anode stop 7.

A beam-limiting stop 27 having an opening 29 is arranged in the beam path downstream of the anode 7. The shape of the opening 29, which is typically circular, determines the cross section of the particle beam 5 in the subsequent beam path.

The particle beam 5 passes through an objective lens 11, which is illustrated schematically in the form of an ellipse in FIG. 1, and is focused by the objective lens 11 at the surface of an object 13. The focusing magnetic field of the objective lens 11 is generated by a coil 15 through which current flows. The current is supplied to the coil 15 by the controller 12. The objective lens 11 is thus excited by the current flowing through the coil 15. The strength of this current is settable by way of the controller 12. The value representing the strength of the current will be referred to below as objective lens excitation value. It is possible in the method explained below to use other variables than the value of the current for the objective lens excitation value, as long as the objective lens excitation value represents the excitation of the objective lens.

Within the objective lens or, viewed in the direction of the beam path between the particle beam 3 and the object 13, just before or just after the objective lens 11, a scan deflector 17 is arranged, which is controlled by the controller 12 and used to displace the focus of the particle beam 5 on the object 13. Lines 19 in FIG. 1 indicate two different scan deflections that occur for two different excitations of the scan deflector 17. The particle beam microscope 1 furthermore includes a detector 21 for secondary electrons or backscattered electrons, which are separated from the object 13 by the incident particle beam 5. To record an image using the particle beam microscope 1, the focus of the particle beam 5 is scanned systematically over an extended region on the surface of the object 13 by way of the excitation of the scan deflector 17, with the excitation being controlled by the controller 12. Meanwhile, the detector 21 detects electrons and produces signals that correspond to the detected electrons and are read by the controller 12. The controller 12 stores the signals in association with the locations at which the particle beam 5 is directed at the time of the detection of the respective signal. The entirety of these data represents one image of the object 13 recorded with the particle beam microscope 1.

The quality of the recorded image depends on how well the particle beam 5 is focused at the surface of the object 13 by the objective lens 11. Imaging aberrations of the objective lens 11 impair the result. Imaging aberrations are typically lower when the particle beam used is centred with respect to a main axis 23 of the objective lens 11. In order to centre the particle beam 5 with respect to the main axis 23 of the objective lens 11, a beam deflector 25, which is likewise controlled by the controller 12, is provided between the particle source 3 and the objective lens 11. The beam deflector 25, used for adjustment purposes, can be an electrostatic deflector or a magnetic deflector or a combination of an electrostatic deflector and a magnetic deflector. Accordingly, a voltage or current is supplied to the beam deflector 25 by the controller 12 in order to deflect the particle beam 5 by a settable angle as it passes through the beam deflector 25. The value representing the magnitude of the voltage or the strength of the current will be referred to below as beam deflector excitation value. It is possible in the method explained below to use other variables than the value of the voltage or the current for the beam deflector excitation value, as long as the beam deflector excitation value represents the excitation of the beam deflector.

Figure 2:
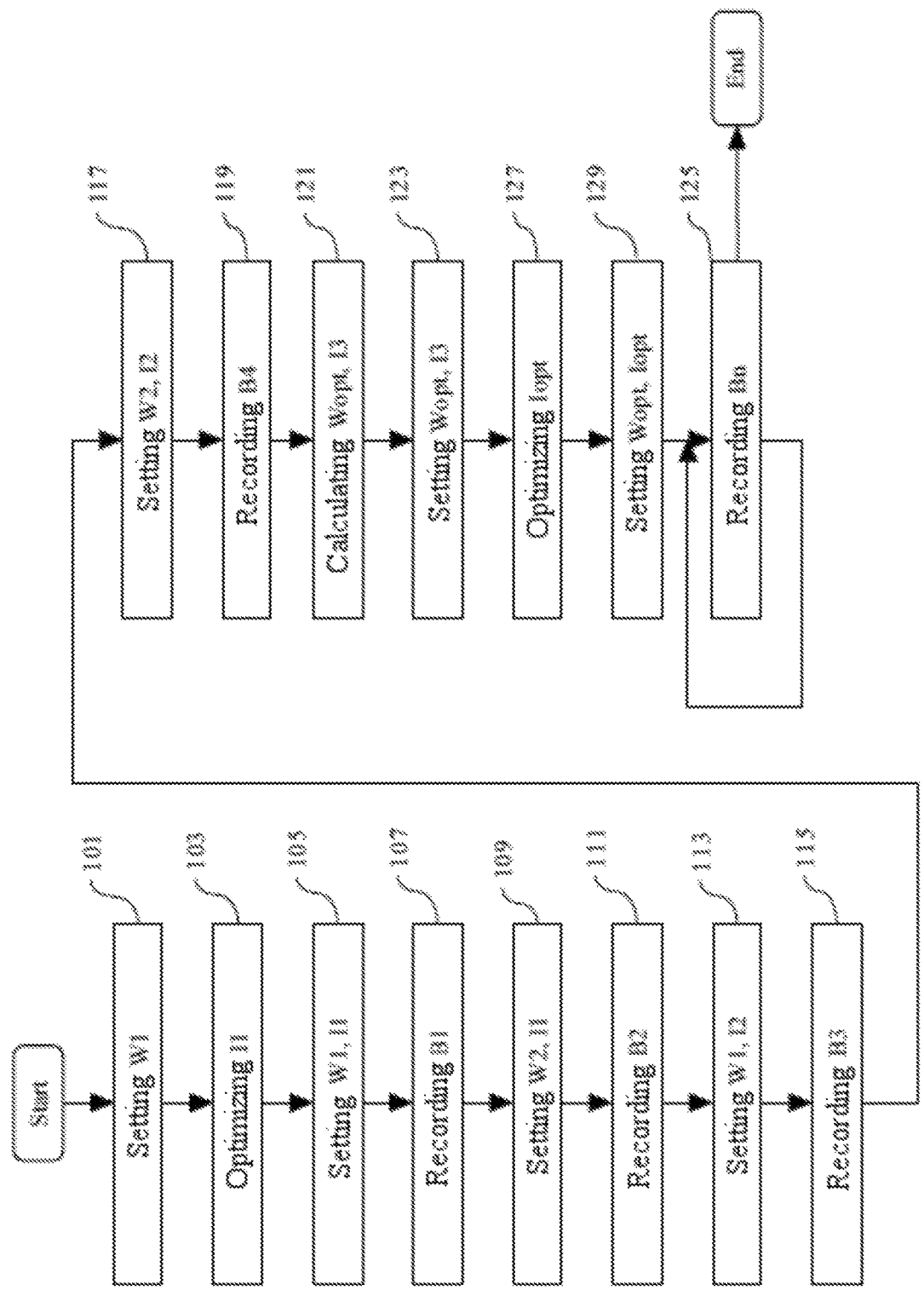
FIG. 2 shows a flowchart explaining a method for adjusting a particle beam microscope according to one embodiment.

In FIG. 1, the particle beam 5 passing without deflection through the beam deflector 25 is illustrated in solid lines 5 and 19, while dashed lines 5' and 19' represent the particle beam that is deflected by the beam deflector 25 by an angle α. The non-deflected beam and the beam that has been deflected by the angle α pass through the objective lens at different positions relative to the main axis 23 thereof. It is now the adjustment task to set the angle α such that the particle beam 5 is centred with respect to the main axis 23 of the objective lens 11 as it passes through the latter. For this purpose, the method explained below with reference to FIG. 2 is performed automatically by the controller 12.

First, in a step 101, the excitation of the beam deflector 25 is set to a first beam deflector excitation value W1. This value can be chosen arbitrarily, for example, it can correspond to an excitation which has not yet been used in the method or it can be a value that has previously provided a good result. Next, the excitation of the objective lens 11 is changed such that a desired image sharpness criterion is met. To this end, an image of the object can be repeatedly recorded and the excitation of the objective lens changed in order to determine the quality of the focusing by analysing the recorded images. The excitation of the objective lens can then be changed, in a step 103, until the desired image sharpness criterion is met. The resulting value of the excitation of the objective lens is used in the subsequent method as the first objective lens excitation value I1. It is also possible here to use a previously set excitation of the objective lens 11 as the first objective lens excitation value I1, without repeatedly recording and analysing images with respect to the improvement of the image sharpness criterion, if it is known from the previously set excitation of the objective lens 11 that it has already provided images with acceptable image sharpness, which does not have to be the maximum attainable image sharpness. Step 103 can thus be omitted.

In a step 105, the excitation of the beam deflector 25 is set to the first beam deflector excitation value W1, and the excitation of the objective lens is set to the first objective lens excitation value I1. In a step 107, a first image B1 is recorded with the settings of step 105. Next, in a step 109, the setting of the excitation of the beam deflector is changed to a second beam deflector excitation value W2, while the setting of the excitation of the objective lens is maintained at the first objective lens excitation value I2. Next, in a step 111, a second image B2 is recorded with the settings of step 109. Next, in a step 113, the excitation of the beam deflector 25 is again set to the first beam deflector excitation value W1, while the excitation of the objective lens is set to a second objective lens excitation value I2. The second objective lens excitation value can be, for example, 1.01 times the first objective lens excitation value.

In a step 115, a third image B3 is recorded with the settings of step 113. Next, in a step 117, the excitation of the beam deflector 25 is set to the second beam deflector excitation value W2, while the excitation of the objective lens remains set to the second objective lens excitation value I2. In a step 119, a fourth image B4 is recorded with the settings of step 117.

Then, in a step 121, an optimized beam deflector excitation value Wopt is calculated from the four recorded images B1, B2, B3 and B4. This calculation can be performed, for example, on the basis of equations that can be found in EP 2 309 530 B1, the entire disclosure of which is incorporated in the present application.

Furthermore, in step 121, a third objective lens excitation value I3 is determined. The third objective lens excitation value can be determined in particular such that the following relation is satisfied:

$$I3=I1+K*(I2-I1)$$

wherein

I1 is the first objective lens excitation value,
I2 is the second objective lens excitation value,
I3 is the third objective lens excitation value, and
K is a predetermined value.

The third objective lens excitation value is determined here such that the focusing magnetic field produced by the objective lens 11 substantially has the same strength as at the excitation of the objective lens 11 with the first objective lens excitation value during the recording of the images B1 and B2 in steps 107 and 111.

As a result, in a step 123, the excitation of the beam deflector 25 can be set to the optimized beam deflector excitation value Wopt, and the excitation of the objective lens 11 can be set largely optimally by setting it to the third objective lens excitation value I3 in a manner such that next, in a step 125, further images Bn of the object can be recorded, which are the actual goal of the examination. These images have a relatively high image quality, because they are recorded with a particle beam which is centred with respect to the main axis of the objective lens.

It is possible, if desired, after the setting of the excitation of the beam deflector to the optimized beam deflector excitation value Wopt and the setting of the objective lens to the third objective lens excitation value I3 in step 123 to further improve the excitation of the objective lens by optimizing the objective lens proceeding from the third objective lens excitation value in a step 127 with respect to fulfilling an image sharpness criterion, as has already been explained above in connection with step 103. The resulting optimized objective lens excitation value Iopt can then, in a step 129, be used together with the optimized beam deflector excitation value Wopt to record in step 125 the plurality of images Bn which are the goal of the examination of the object.

Figure 3:
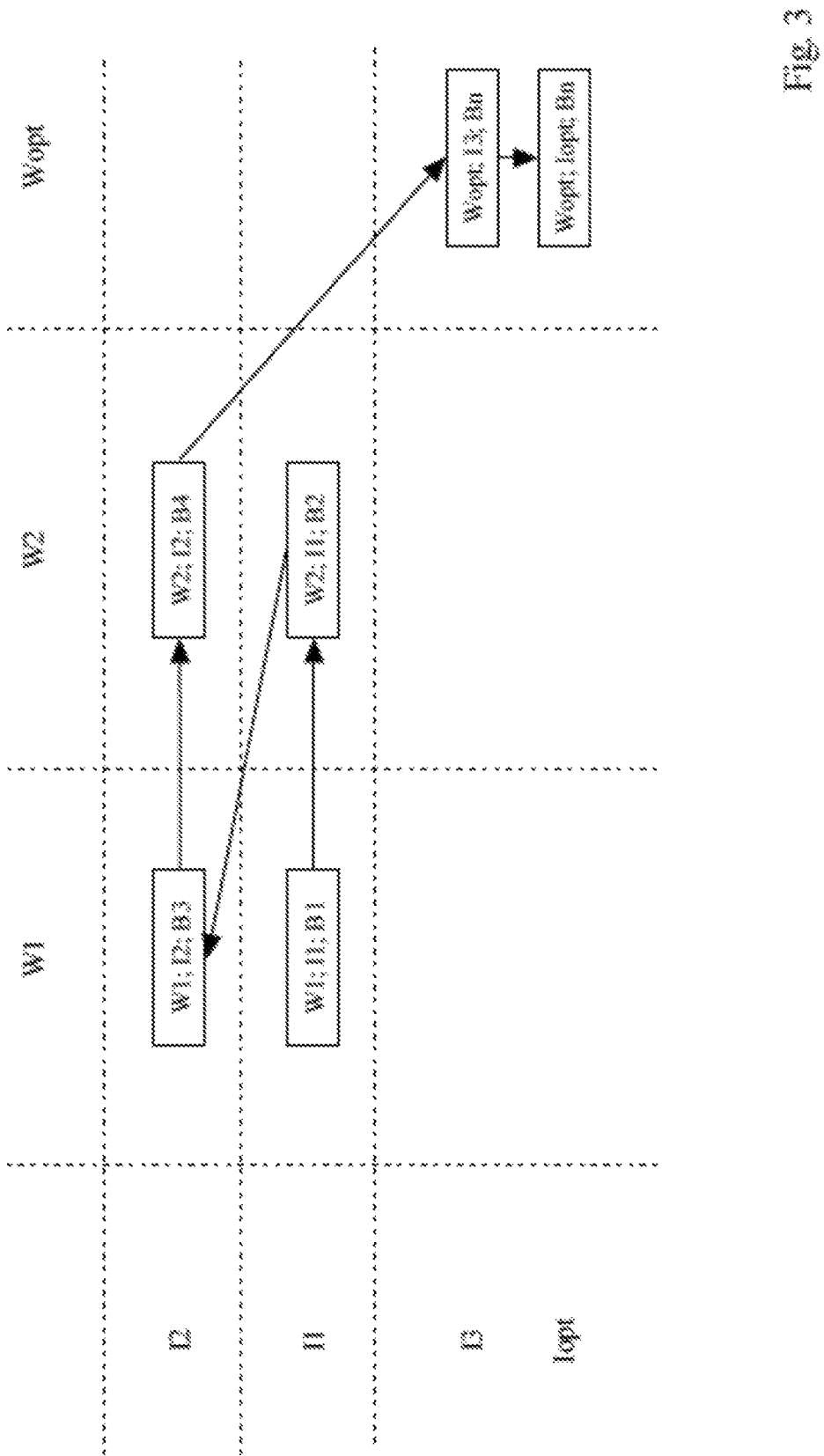

The method explained with reference to FIG. 2 is illustrated schematically in an alternative manner in FIG. 3. FIG. 3 shows the settings for the objective lens excitation value and the beam deflector excitation value, which are obtained successively in terms of time, as blocks which are positioned in a two-dimensional field and connected by arrows, with the arrows representing the chronological sequence. The values W1, W2 and Wopt of the beam deflector excitation are illustrated horizontally next to one another, and the different values I1, I2, I3 and Iopt of the objective lens excitation are illustrated vertically next to one another. It can be seen that at the objective lens excitation value I1, the images B1 and B2 are recorded immediately one after the other at the different beam deflector excitation values W1 and W2. Similarly, the two images B3 and B4 with the beam deflector excitation values W1 and W2 respectively are recorded immediately one after the other at the same objective lens excitation value I2. For this reason, even in the case of an existing hysteresis of the objective lens, the two images B1 and B2 are recorded at the same strength of the focusing magnetic field. Likewise, the two images B3 and B4 are recorded at the same strength of the focusing magnetic field.

Figure 5:
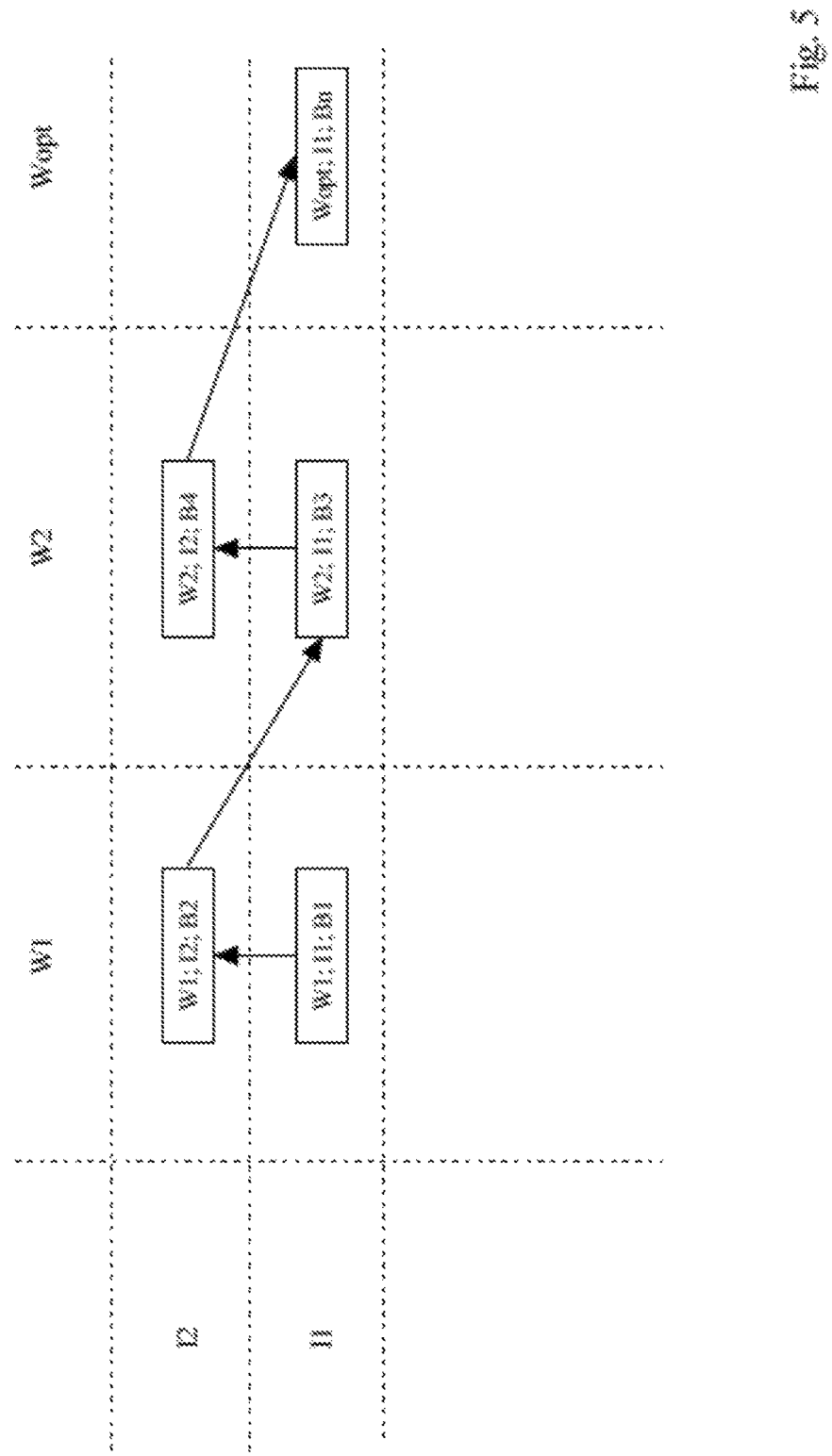
FIG. 5 shows a schematic illustration explaining a conventional method.

In the conventional method illustrated in FIG. 5 in accordance with FIG. 2 of EP 2 309 530 B1, this is clearly not the case. Due to the hysteresis of the objective lens, the two images B1 and B3 are not recorded at the same strength of the focusing magnetic field, although this was assumed. The same is true for the two images B2 and B4.

In the method explained with reference to FIG. 3, the objective lens excitation is set, after the four images B1 to B4 have been recorded, to the value I3 in order to record further images Bn. Here, the objective lens excitation value I3 is determined such that, at this value, the objective lens produces, while taking account of the hysteresis thereof, substantially the same focusing magnetic field as previously at the objective lens excitation value I1 for recording the images B1 and B2. This setting is performed because it was previously known that well-focused images can be produced at the objective lens excitation value I1. At the same time, it is possible, if desired, to further optimize the focusing on the basis of, for example, an image sharpness criterion, and to use the optimized objective lens excitation value Iopt which is then obtained for the recording of the further images.

Figure 4:
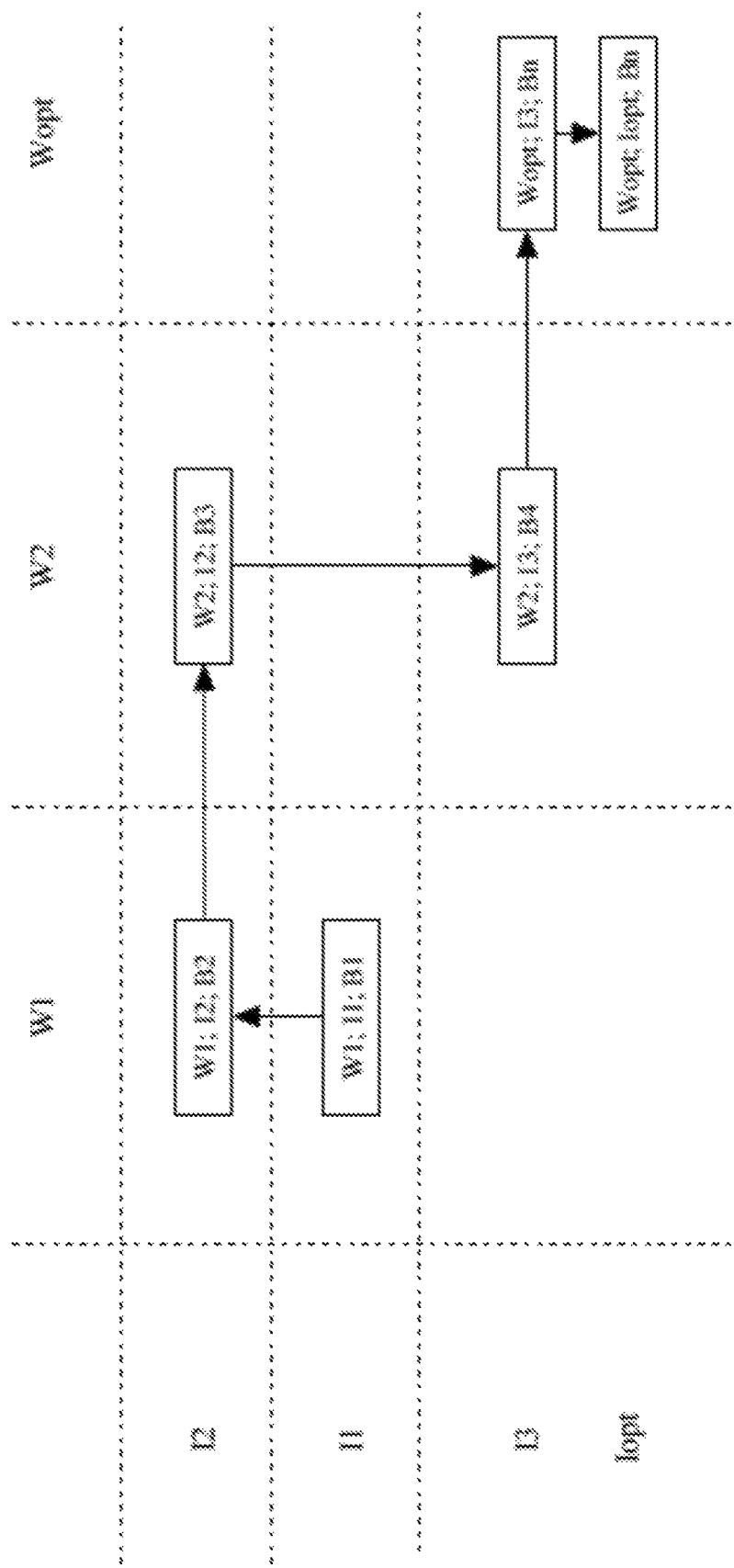
FIG. 4 shows a schematic diagram explaining a further embodiment of a method for adjusting a particle beam microscope in the manner of FIG. 3.

FIG. 4 shows a further embodiment of a method for adjusting a particle beam microscope. Here, once again four images B1, B2, B3 and B4 are recorded at different settings of the beam deflector and the objective lens in order to determine an optimized beam deflector excitation value Wopt. In this case, the excitation of the objective lens is changed between the recording of the first image B1 and of the second image B2 from a first objective lens excitation value I1 to a second objective lens excitation value I2. However, the images B2 and B3 are recorded, at different beam deflector excitation values W1 and W2, at the same objective lens excitation value I2. The fourth image B4 is then recorded at the objective lens excitation value I3, which differs from the second objective lens excitation value I2 and the first objective lens excitation value I1 and is determined such that, at the third objective lens excitation value I3, taking account of the hysteresis, a focusing magnetic field is obtained, which is generated by the objective lens and is substantially identical to the magnetic field which was previously obtained during the recording of the first image B1 by the excitation of the objective lens with the first objective lens excitation value I1. Consequently, the two images B1 and B4 are recorded with substantially the same focusing magnetic field.

Similarly as in the method explained with reference to FIG. 3, in the method according to FIG. 4 as well, the optimized beam deflector excitation value Wopt is set after the recording of the four images B1 to B4, and further images Bn can be recorded at the third objective lens excitation value I3. It is furthermore also possible to further improve the focusing for example with respect to an image sharpness criterion so as to obtain an optimized objective lens excitation value Iopt in order to use it to record the further images.

In the previously explained embodiments, a single beam deflector 25 is used as the beam adjustment device in order to deflect the beam generated by the particle source 3 by an angle α such that it passes through the objective lens 11 in a manner such that any aberrations that occur are reduced as much as possible. It is alternatively possible to provide in the beam path two deflectors one behind the other, which can be actuated, for example, to successively deflect the beam in opposite directions, with the result that it undergoes a parallel displacement. Here, the previously explained method for adjustment is accordingly applied such that the two deflectors are excited in a manner such that they displace the beam such that it passes through the objective lens 11 in a manner such that any aberrations that occur are reduced as much as possible.

In the previously explained embodiments, the beam deflector 25 is used as the beam adjustment device in order to adjust the beam generated by the particle source 3 such that it passes through the objective lens 11 in a manner such that any aberrations that occur are reduced as much as possible. Alternatively or additionally, further possibilities of using components of the particle beam microscope 1 as the beam adjustment device exist.

One such possibility will be explained below with reference to FIG. 1. Here, an arrow 31 symbolically illustrates that the stop 27, which determines the cross section of the particle beam 5 in the subsequent beam path, is displaceable transversely to the direction of the particle beam 5. The displacement is performed by an actuator 33, such as for example a stepper motor, controlled by the controller 12 and can be effected in two mutually orthogonal directions. A measurement system can be provided, which measures the position of the stop 27 relative to other components of the particle beam microscope 1 and transmits it to the controller such that the setting of the position of the stop 27 can be effected in a feedback-based manner.

The displacement of the stop 27 transversely to the direction of the beam results in a displacement of the beam in the plane of the objective lens 11, with the result that the stop 27 can also be used as a beam adjustment device to set the beam such that it passes through the objective lens 11 in a manner such that any aberrations that occur are reduced as much as possible.

The methods explained with reference to FIGS. 3 and 4 can be adapted in a simple manner to the use of the stop 27 as a beam adjustment device by using the settings W1, W2 and Wopt of the excitation of the beam deflector 25 as settings of the position of the stop 27 and by the method being performed accordingly.

In the previously explained embodiments, the adjustment of the particle beam is effected relative to the objective lens. A particle beam microscope of course typically includes further components in relation to which the particle beam can be adjusted or which can be adjusted relative to the particle beam so as to attain desired criteria during the operation of the particle beam microscope. For example, the previously explained particle beam microscope 1 can additionally have a stigmator. The latter is not excited during the performance of the previously explained methods for adjustment, with the result that first, the particle beam can be aligned relative to the objective lens. Then, the quadrupole field of the stigmator is centred relative to the particle beam. This can be effected by mechanically displacing the stigmator relative to the particle beam, or by a dipole field being superimposed on the quadrupole field of the stigmator such that the axis of symmetry of the quadrupole field substantially coincides with the particle beam. The strength and the orientation of the quadrupole field can then be set such that the desired criteria for the operation of the particle beam microscope are attained.

What is claimed is:

1. A method of adjusting a particle beam microscope comprising a particle source for producing a particle beam, an objective lens for focusing the particle beam on an object, and a beam adjustment device arranged in the beam path between the particle source and the objective lens, the method comprising:
   in a measure A, setting the beam adjustment device to a first setting, setting an excitation of the objective lens to a first objective lens excitation value, and recording a first image of the object;
   in a measure B, setting the beam adjustment device to a second setting different from the first setting, setting the excitation of the objective lens to the first objective lens excitation value (I1), and recording a second image of the object;
   in a measure C, setting the beam adjustment device to the first setting, setting the excitation of the objective lens to a second objective lens excitation value (I2) different from the first objective lens excitation value (I1), and recording a third image of the object;
   in a measure D, setting the beam adjustment device to the second setting, setting the excitation of the objective lens to the second objective lens excitation value (I2), and recording a fourth image of the object;
   determining an optimized setting of the beam adjustment device based on the first, second, third image and fourth images;
   determining a third objective lens excitation value (I3); and
   setting the beam adjustment device to the optimized setting, setting the excitation of the objective lens to the third objective lens excitation value (I3), and recording at least one further image,
   wherein K is a predetermined value, and I3=I1+K*(I2−I1).

2. The method of claim 1, wherein:
   the measure A is performed before or after the measure B;
   the measure C is performed before or after the measure D; and
   the measures A and B are performed before the measures C and D.

3. The method of claim 2, further comprising, before performing the measures A and B, optimizing an image sharpness criterion by changing the excitation of the objective lens and using the objective lens excitation value at which the optimized image sharpness criterion is achieved as the first objective lens excitation value (I1).

4. The method of claim 3, wherein the beam adjustment device is set to the first setting during the optimization of the image sharpness criterion.

5. The method of claim 2, further comprising:
   after the recording of the at least one further image, optimizing an image sharpness criterion by changing the excitation of the objective lens while maintaining the setting of the beam adjustment device to the optimized setting; and
   setting the beam adjustment device to the optimized setting, setting the excitation of the objective lens to the optimized objective lens excitation value at which the optimized image sharpness criterion is achieved, and recording at least one further image.

6. The method of claim 2, wherein:
   the beam adjustment device comprises a member selected from the group consisting of an electrostatic beam deflector that is excitable with electrical voltage and a magnetic beam deflector that is excitable with electric current; and setting the beam adjustment device comprises setting an excitation of the beam deflector.

7. The method of claim 2, wherein:

the beam adjustment device comprises a stop which comprises a plate and a hole in the plate through which the particle beam passes;

the stop is displaceable in at least one direction transversely to the direction of the particle beam; and setting the beam adjustment device comprises setting of a position of the stop in the at least one direction.

8. The method of claim 1, further comprising, before performing the measures A and B, optimizing an image sharpness criterion by changing the excitation of the objective lens and using the objective lens excitation value at which the optimized image sharpness criterion is achieved as the first objective lens excitation value (I1).

9. The method of claim 8, wherein the beam adjustment device is set to the first setting during the optimization of the image sharpness criterion.

10. The method of claim 1, further comprising:

after the recording of the at least one further image, optimizing an image sharpness criterion by changing the excitation of the objective lens while maintaining the setting of the beam adjustment device to the optimized setting; and setting the beam adjustment device to the optimized setting, setting the excitation of the objective lens to the optimized objective lens excitation value at which the optimized image sharpness criterion is achieved, and recording at least one further image.

11. The method of claim 1, wherein:

the beam adjustment device comprises a member selected from the group consisting of an electrostatic beam deflector that is excitable with electrical voltage and a magnetic beam deflector that is excitable with electric current; and setting the beam adjustment device comprises setting an excitation of the beam deflector.

12. The method of claim 1, wherein:

the beam adjustment device comprises a stop which comprises a plate and a hole in the plate through which the particle beam passes;

the stop is displaceable in at least one direction transversely to the direction of the particle beam; and setting the beam adjustment device comprises setting of a position of the stop in the at least one direction.

13. A method of adjusting a particle beam microscope comprising a particle source for producing a particle beam, an objective lens for focusing the particle beam on an object, and a beam adjustment device arranged in the beam path between the particle source and the objective lens, the method comprising:

in a measure A, setting the beam adjustment device to a first setting, setting an excitation of the objective lens to a first objective lens excitation value (I1), and recording a first image of the object;

after the measure A, in a measure B setting the beam adjustment device to the first setting, setting the excitation of the objective lens to a second objective lens excitation value (I2), which differs from the first objective lens excitation value (I1), and recording a second image of the object;

after the measure B, in a measure C, setting the beam adjustment device to a second setting different from the first setting, setting the excitation of the objective lens to the second objective lens excitation value (I2), and recording a third image of the object;

after the measure C, in a measure D, setting the beam adjustment device to the second setting, setting the excitation of the objective lens to a third objective lens excitation value (I3), which differs from the first objective lens excitation value (I1) and from the second objective lens excitation value (I2), and recording a fourth image of the object;

determining an optimized setting of the beam adjustment device based on the first image, the second image, the third image and the fourth image;

determining the third objective lens excitation value (I3); and setting the beam adjustment device to the optimized setting, setting the excitation of the objective lens to the third objective lens excitation value (I3), and recording at least one further image, wherein K is a predetermined value, and I3=I1+K*(I2−I1).

14. The method of claim 13, further comprising, before performing the measures A and B, optimizing an image sharpness criterion by changing the excitation of the objective lens and using the objective lens excitation value at which the optimized image sharpness criterion is achieved as the first objective lens excitation value (I1).

15. The method of claim 14, wherein the beam adjustment device is set to the first setting during the optimization of the image sharpness criterion.

16. The method of claim 14, further comprising:

after the recording of the at least one further image, optimizing an image sharpness criterion by changing the excitation of the objective lens while maintaining the setting of the beam adjustment device to the optimized setting; and setting the beam adjustment device to the optimized setting, setting the excitation of the objective lens to the optimized objective lens excitation value at which the optimized image sharpness criterion is achieved, and recording at least one further image.

17. The method of claim 14, wherein:

the beam adjustment device comprises a member selected from the group consisting of an electrostatic beam deflector that is excitable with electrical voltage and a magnetic beam deflector that is excitable with electric current; and setting the beam adjustment device comprises setting an excitation of the beam deflector.

18. The method of claim 13, further comprising:

after the recording of the at least one further image, optimizing an image sharpness criterion by changing the excitation of the objective lens while maintaining the setting of the beam adjustment device to the optimized setting; and setting the beam adjustment device to the optimized setting, setting the excitation of the objective lens to the optimized objective lens excitation value at which the optimized image sharpness criterion is achieved, and recording at least one further image.

19. The method of claim 13, wherein:

the beam adjustment device comprises a member selected from the group consisting of an electrostatic beam deflector that is excitable with electrical voltage and a magnetic beam deflector that is excitable with electric current; and setting the beam adjustment device comprises setting an excitation of the beam deflector.

20. The method of claim 13, wherein:
the beam adjustment device comprises a stop which comprises a plate and a hole in the plate through which the particle beam passes;
the stop is displaceable in at least one direction transversely to the direction of the particle beam; and
setting the beam adjustment device comprises setting of a position of the stop in the at least one direction.

* * * * *